United States Patent [19]

Watson et al.

[11] 3,886,541

[45] May 27, 1975

[54] EXPONENTIAL RAMP A/D CONVERTER

[75] Inventors: George A. Watson, Tustin; John J. Bollinger, Orange, both of Calif.

[73] Assignee: Rockwell International Corporation, El Segundo, Calif.

[22] Filed: Apr. 25, 1973

[21] Appl. No.: 354,298

[52] U.S. Cl. .......... 340/347 AD

[51] Int. Cl. .......... H03k 13/16

[58] Field of Search .......... 340/347 AD; 235/154; 324/99 D

[56] References Cited

UNITED STATES PATENTS

| | | | |
|---|---|---|---|
| 2,781,970 | 2/1957 | Kaukman | 340/347 AD X |
| 2,963,697 | 12/1960 | Giel | 340/347 AD |
| 3,111,662 | 11/1963 | Pierce | 340/347 AD |
| 3,192,371 | 6/1965 | Brahm | 340/347 AD X |
| 3,305,856 | 2/1967 | Jenkinson | 340/347 AD |
| 3,478,348 | 11/1969 | Molyneux | 340/347 AD |
| 3,668,691 | 6/1972 | Sergo, Jr. | 340/347 AD |
| 3,678,505 | 7/1972 | Mostyn, Jr. | 340/347 AD |
| 3,683,369 | 8/1972 | Stern | 340/347 AD |
| 3,737,897 | 6/1973 | Cuthbert | 340/347 AD |
| 3,772,679 | 11/1973 | Scheer | 340/347 AD |

*Primary Examiner*—Charles D. Miller
*Attorney, Agent, or Firm*—H. Frederick Hamann; G. Donald Weber, Jr.

[57] ABSTRACT

An analog to digital converter which converts an analog signal to a digital signal. The analog signal is representative of a particular analog function or phenomenon and is digitized for use in a digital computer or the like. A ramp signal source establishes a control signal which is used in the A/D converter. High and low voltage limits are established for the circuit operation. These high and low level limits control the active and inactive portions of the circuit. Logic circuitry operates in response to the level limits to selectively activate or inactivate portions of the digitizing circuit and to establish a control function for the ramp circuit.

14 Claims, 2 Drawing Figures

EXPONENTIAL RAMP A/D CONVERTER

BACKGROUND OF THE INVENTION

The field of invention is broadly analog to digital converters. Many analog to digital converters are known in the art. Many analog to digital conversion techniques have been disclosed. However, different applications frequently require analog to digital converters having a unique or improved functional capability directed to the particular application.

There are many areas wherein suitable variable elements function to produce variable signals which represent a parameter in a particular device. The parameter may represent a variation in temperature, pressure, position or the like. Usually, in a position detector, a potentiometer or other device having a wiper contact is used to provide the analog signal. This technique is known in the art.

Nevertheless, even though many A/D converters are known in the art, other A/D converters having improved operating characteristics for specific applicatiions are useful and desirable.

SUMMARY OF THE INVENTION

An A/D converter uses an exponential ramp signal to assist in digitizing an analog voltage. A plurality of comparators compare the ramp signal with various analog signals to control operation of logic circuitry. The logic circuitry controls several registers wherein a digitized version of a sensed analog signal is produced.

DESCRIPTION OF THE PREFERRED EMBODIMENT

Figures 1, 2:
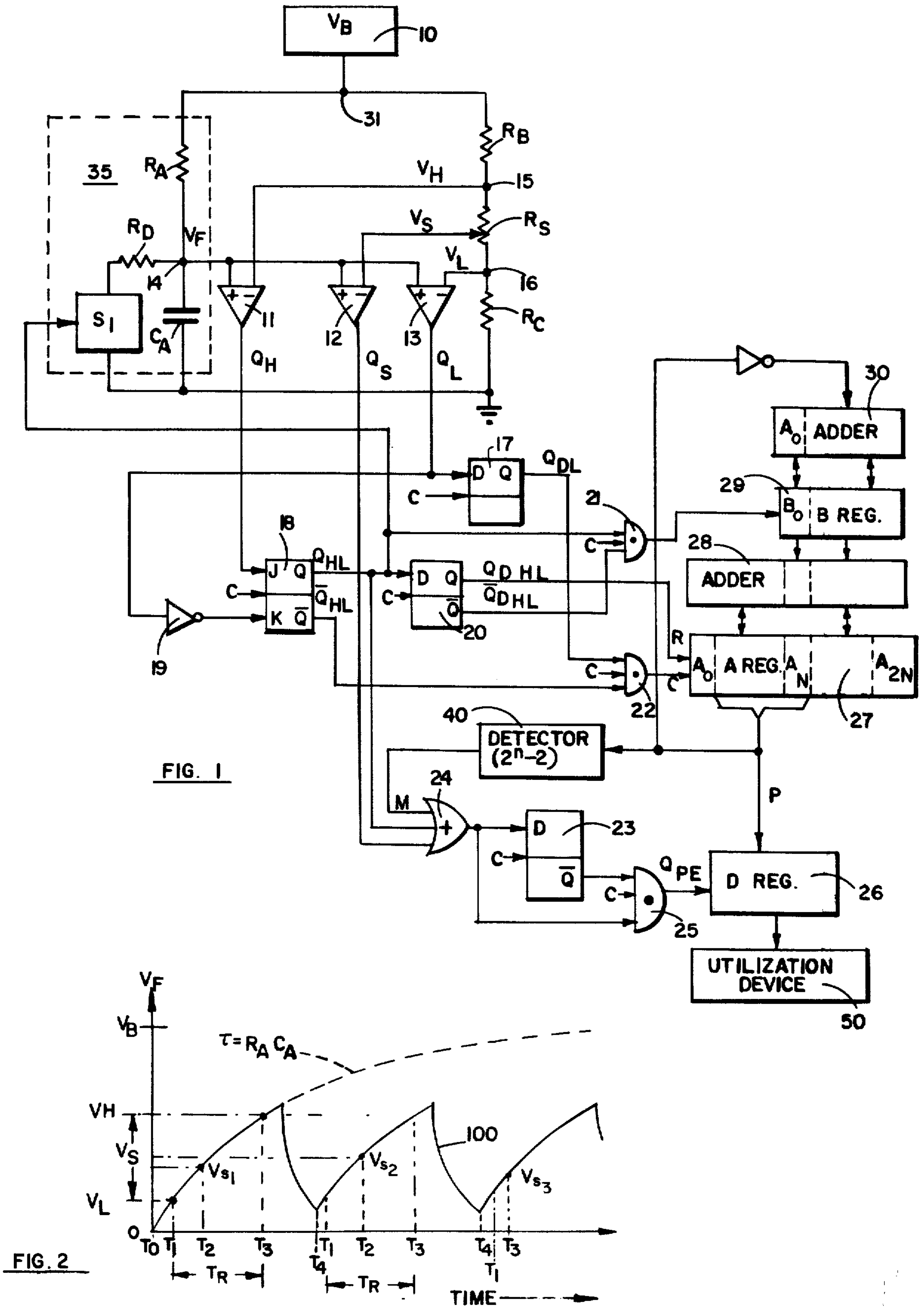
FIG. 1 is a partially block, partially schematic diagram of a preferred embodiment of the invention.
FIG. 2 is a graphic representation of the exponential ramp analog signal which is used to control the operation of the circuit shown in FIG. 1.

Referring now to FIG. 1, there is shown a preferred embodiment of the instant invention. A suitable source 10 which supplies substantially constant voltage $V_B$ is connected to node 31. A voltage divider network including resistors $R_B$, $R_S$ and $R_C$ is connected between node 31 and a suitable reference potential, for example ground. Resistors $R_B$ and $R_C$ are fixed resistors while resistor $R_S$ is a variable resistor, such as a potentiometer. Resistor $R_S$ is connected, in series, between resistors $R_B$ and $R_C$. The common junction 15 between resistors $R_B$ and $R_S$ is connected to the inverting input terminal of differential comparator 11. Common junction 16 between resistors $R_S$ and $R_C$ is connected to the inverting input terminal of differential comparator 13. The wiper arm or variable tap of resistor $R_S$ is connected to the inverting input terminal of differential comparator 12. The non-inverting input terminals of each of differential comparators 11, 12 and 13 are connected to node 14 in sawtooth generator circuit 35. Generator circuit 35 produces an exponential sawtooth voltage $V_F$ is supplied to the differential comparators via node 14. Signal $V_H$ and signal $V_L$ are produced at terminals 15 and 16, respectively, and establish the high and low limits for voltage operation of the circuit as described hereinafter. Signal $V_S$, the sensed or detected signal is produced at the wiper arm or tap of resistor $R_S$. Resistor $R_S$ may be a typical potentiometer which is driven by a control element whereby the position of the control element is established.

Sawtooth generator circuit 35 includes resistor $R_A$ and capacitor $C_A$ connected in series between node 31 and ground potential. The common junction thereof is node 14 which is also connected to one terminal of resistor $R_D$. Switch S1 is connected between the other terminal of resistor $R_D$ and ground. The control terminal of switch S1 is connected to the logic circuitry as described hereinafter. In one embodiment, switch S1 may comprise a typical FET switch having the source-drain path connected from resistor $R_D$ to ground and the gate electrode connected to receive the $Q_{HL}$ control signal.

The logic circuitry includes D-type flip-flop 17 which has the D-input terminal thereof connected to the output terminal of differential comparator 13 to receive the signal $Q_L$. The clock terminal of flip-flop 17 is connected to receive the system clock signal C. Flip-flop 17 serves to synchronize signal $Q_L$ to the system clock. The Q output terminal of flip-flop 17 is connected to supply the signal $Q_{DL}$ to one input terminal of AND gate 22.

The output terminal of comparator 13 is also connected to supply the signal $Q_L$ to the K input of JK flip-flop 18 via inverter 19. The output terminal of comparator 11 is connected to supply signal $Q_H$ to the J input terminal of JK flip-flop 18. The system clock signal C is also supplied to the clock terminal of flip-flop 18. The Q output terminal of flip-flop 18 is connected to supply signal $Q_{HL}$ to switch S1 and selectively causes capacitor $C_A$ to be discharged towards ground. The output signal $\overline{Q}_{HL}$ is produced at the $\overline{Q}$ output terminal of flip-flop 18. This terminal is connected to a third input of AND gate 22.

The output terminal of comparator 12 is connected to supply the output signal $Q_S$, which is indicative of the voltage condition $V_F \geq V_S$, to an output terminal of OR gate 24. Another input terminal of OR gate 24 is connected to receive the output of detector 40. The remaining input terminal of OR gate 24 is connected to receive the signal $Q_{HL}$. The output terminal of OR gate 24 is connected to the D input terminal of D-type flip-flop 23 and one input of AND gate 25. Another input terminal of AND gate 25 is connected to the Q output terminal of flip-flop 23. The clock signal C is supplied to the other input of AND gate 25 and to the clock terminal of flip-flop 23. The signal $Q_{PE}$ is one clock pulse for each false to true transition of the output signal produced by OR gate 24.

The output terminal of AND gate 25 is connected to supply the signal $Q_{PE}$ to the clock input terminal of register 26. The output terminals of register 26 are connected to utilization device 50. While a parallel connection is suggested, a serial connection from register 26 to utilization device 50 can also be implemented.

The $Q_{HL}$ output signal from the Q output terminal of flip-flop 18 is supplied to the D input terminal of flip-flop 20 as well as to an input terminal of AND gate 21 and to the control terminal of switch S1. The clock terminal of flip-flop 20 is connected to receive the clock signal C. The Q output terminal of flip-flop 20 is connected to supply the signal $Q_{DHL}$ to the reset terminal of register 27. The $\overline{Q}$ output terminal of flip-flop 20 is connected to supply the signal $\overline{Q}_{DHL}$ to another input of AND gate 21. The third input of AND gate 21 is connected to receive the clock signal C. The output terminal of AND gate 21 is connected to the clock input terminal of register 29. The output signal of AND gate 21 is one clock pulse for each false to true transition of $Q_{HL}$.

Adder 30 is connected to receive portions of the signal contents of register 27 while register 29 is connected to receive and to supply signals to adder 30. Register 27 is connected to receive and to supply signals to adder 28. Adder 28 is also connected to receive signals from register 29. In addition, portions of the signal contents of register 27, i.e. signal P, are supplied to register 26. These same signals are applied to detector 40 which supplies signal M to OR gate 24 representative of the condition $P=2^n-2$. The contents of register 26 are supplied to utilization device 50 in response to signal $Q_{PE}$ as noted supra.

The operation of the circuit is best understood when FIGS. 1 and 2 are reviewed concurrently. In particular, resistors $R_A$ and $R_D$ along with capacitor $C_A$ and switch S1 form a sawtooth generator network 35. A typical exponential sawtooth wave 100 is shown in FIG. 2. The wave shape shown in FIG. 2 is somewhat exaggerated for illustrative purposes. The sawtooth wave 100 represents voltage $V_F$ produced at node 14 in network 35. As will become evident, the sawtooth voltage $V_F$ is made to oscillate between upper and lower voltages $V_H$ and $V_L$, respectively. This oscillation is essentially controlled by a selective opening and closing of switch S1 at appropriate times.

In addition, voltage $V_F$ sweeps, in an exponential manner, from $V_L$ to $V_H$ in a time $T_R$. That is, the values of $R_A$ and $R_C$ are chosen so that the nominal value of $T_R$ is $$T_{R\ nom.} = 2^N T_C$$

where $T_C$ is the period of the system clock signal C.

In addition, the voltage divider formed by fixed calibrating resistors $R_B$ and $R_C$ along with potentiometer $R_S$ is utilized to produce voltages $V_H$, $V_L$ and $V_S$. The voltage $V_S$ is functionally related to k, the ratio of the resistance between the wiper and the lower terminal of the potentiometer relative to the total potentiometer resistance. Therefore, $V_S$ is also proportional to the sensed quantity or parameter represented by resistor $R_S$. The signals produced by the voltage divider network are connected to the differential comparators 11, 12 and 13 as noted supra. These signals are compared with the feedback voltage $V_F$ generated by the sawtooth generator 35. The equations for each of the voltages is as follows:

$$V_S = \frac{R_C + kR_S}{R_B + R_S + R_C} V_B$$

$$V_L = \frac{R_C}{R_B + R_S + R_C} V_B$$

$$V_H = \frac{R_C + R_S}{R_B + R_S + R_C} V_B$$

As will become apparent subsequently, the interaction of various signals is at least a function of the time required for $V_F$ to reach any particular voltage $V_t$ from $V_L$. This time is designated as t where the value of t corresponding to $V_F = V_H$ is $T_R$, noted supra. Thus, generally, $$V_F = V_L + (V_H - V_L)(1 - e^{\frac{t}{\tau}})$$

where $\tau = F_A C_A$. The equation relating to $V_F$ may be rewritten as follows:

$$\frac{V_F - V_H}{V_H - V_L} = -e^{\frac{-t}{\tau}}$$

or $$T_R = \alpha ln \left[\frac{V_H - V_B}{V_B - V_L}\right]$$

If now $V_L$ and $V_H$ are replaced by the equivalent expressions noted supra, this last equation yields the following equation $$T_R = R_A C_A \ ln \left[\frac{R_B + R_S}{R_B}\right]$$

It is clear from this last equation that $T_R$ is not dependent upon the supply voltage $V_B$. The analysis assumes that any changes in $V_B$ occur over a much longer time than $T_R$. This can easily be accomplished by appropriately filtering $V_B$. It can also be shown that $$T_S = R_A C_A \ ln \left[\frac{V_S - V_B}{V_B - V_L}\right]$$

where $T_S$ is the time required for $V_F$ to ramp from $V_L$ to the sensed voltage $V_S$. From this equation it is clear that there is only one value of $T_S$ for each distinct value of $V_S$ and that as $V_S$ increases $T_S$ increases.

Since the digital generation of the output signal P is dependent only upon $T_R$ (as will become evident subsequently), the digitized data is not dependent upon slow supply voltage variations. $T_R$ is a function of resistance and capacitance values only, hence any change in $T_R$ must be caused by a change in resistance and/or capacitance values. Therefore, $T_R$ is restricted to change slowly since resistance and capacitance values change mainly with temperatures and the thermal time constants associated with these components is usually much greater than the conversion period $T_R$. The digital control mechanism is generally required to make only small corrections over many ramp cycles. Consequently, this results in negligible errors in the generation of the digitized signal as a result of resistance and capacitance component value changes with temperature.

With the individual operation of the sawtooth generator and the voltage divider described, and the interaction thereof to produce the various voltage signals, a detailed operation of the entire circuit may be described.

The digital control mechanism is essentially a variable increment counter formed by register 27 and adder 28 with the contents of register 29 representing the variable increment. The upper bits of register 27 i.e. bits $A_0$ through $A_{N-1}$, generate a digital number which increases linearly with time and whose end value (when $V_F$ equals $V_H$) is nominally $2^{N-1}$.

Typically, power is supplied to the comparator circuit shown in FIG. 1 at time T0. At time T0, the voltage $V_F$ is less than any of the voltages $V_H$, $V_S$ or $V_L$ since capacitor $C_A$ should be discharged. As a result, each of comparators 11, 12 and 13 produces a false output signal. It should be noted that a fale signal may be construed as a binary zero, a low level signal, a relatively negative signal or the like. Each of these terms is used interchangeably herein. Thus, signals $Q_H$, $Q_S$, and $Q_L$ produced by comparators 11, 12 and 13, respectively, are all false signals.

In general, the ramp voltage, $V_F$ and $V_L$ at time period T1, where the output signal produced by comparator 13 goes true (thereby through action of flip flops 17 and 18) causing AND gate 22 to clock register 27 with the next application of C, the system clock signal. This causes the contents of register 29 to be added to the contents of register 27 once each clock time, with the result put back into register 27. The outputs of AND gate 25 and AND gate 21 are false preventing the contents of registers 29 and 26 from changing. At time period T2, when $V_S$ equals $V_F$, the output signal $Q_5$ goes true, making the output signal of AND gate 25 true for one clock time. This clocks register 26 once, transferring the digital number P from register 27 into register 26 where it is stored until updated at time period T2 of the next cycle. At time period T3, when $V_F$ equals $V_H$, the output signal $Q_H$ goes true causing the $Q_{HL}$ signal at the Q output terminal of flip-flop 18 to be true at the next clock time. This closes switch S1, and $C_A$ discharges through $R_D$ towards ground. Time period T4 represents the beginning of a new ramp cycle.

When the output signal $Q_H$ of comparator 11 becomes true, the $Q_{HL}$ signal produced by flip flop 18 becomes true at the next clock time. The $Q_{HL}$ signal in conjunction with the signal $\overline{Q}_{DHL}$, causes the output of AND gate 21 to clock register 29 once at clock signal C. With this clock to register 29, the error $(P_F - P_{Fn})$ in P is fed back into register 29 in such a way as to reduce the error in P at the end of the next cycle.

More particularly, the false signal $Q_H$ is applied to the J input of the JK flip-flop 18. In addition, false signal $Q_S$ is supplied to one input of OR gate 24. The false signal $Q_L$ is supplied to the D-input terminal of D-type flip-flop 17 and to the K input of flip-flop 18 via inverter 19. Consequently, upon the application of the system clock signal C, the false signal at the D-input terminal of flip-flop 17 is copied or transmitted directly as a false signal $Q_{DL}$ at the output terminal of flip-flop 17. This signal is supplied to one input of AND gate 22. Moreover, the same clock signal will cause a false signal $Q_{HL}$ to be produced at the Q output terminal of flip-flop 18 and a true $\overline{Q}_{HL}$ signal at the $\overline{Q}$ output terminal of flip-flop 18 The output signal $Q_{HL}$ is supplied to the D-input of flip-flop 20 and to the control input of switch S1. The false $Q_{HL}$ signal causes switch S1 to be turned off and non-conductive. As a result, the ramp voltage $V_F$ across capacitor $C_A$ begins to ramp-up in the standard fashion.

Meanwhile, the true signal $\overline{Q}_{HL}$ is supplied to one input of AND gate 22 to enable operation thereof as a function of the remainder of the signals.

The $Q_{HL}$ signal from flip-flop 18 is also supplied directly to one input of AND gate 21. The false condition of this signal will render gate 21 disabled at this time. Consequently, the output signal from gate 21 (which functions as a clock signal to register 29) is not applied. Therefore, there is no interaction between adder 30 and register 29. Likewise, the false condition of signal $Q_{DL}$ will disable AND gate 22 and, thus, prevent operation of register 27 vis-a-vis adder 28.

As the ramp voltage $V_F$ continues to ramp up, voltage $V_F$ becomes equal to voltage $V_L$ at time T1. With this voltage condition, comparator 13 produces a true level $Q_L$ output signal. This true level signal is applied to the D-input of flip-flop 17 and, via inverter 19 to the K input of flip-flop 18. Upon the application of the next clock signal C, the true signal at the input terminal of flip-flop is transferred therethrough and supplied to an input of ANd gate 22. The same clock signal has substantially no effect on flip-flop 18 inasmuch as the J input signal and the K input signal are both false. Consequently, the true signal $\overline{Q}_{HL}$ is maintained by flip-flop 18. Consequently, two true input signals are supplied to gate 22 wherein gate 22 is enabled by each positive excursion of clock signal C. As a result, register 27 is effectively clocked, via gate 22, by clock signals C. In this condition, the contents of register 27 and the contents of register 29 are added with each clock signal. In other words, the contents of A-register 27 are supplied to adder 28 and then returned to register 27 prior to the next clock signal. With the next clock signal, the contents of A-register 27 is added to the contents of adder 28 (the former contents of A-register 27) and then returned to A-register 27. Obviously, a linear ramp-like arrangement of information is stored in A-register 27. Meanwhile, the remainder of the circuit continues in the same status previously established. That is, the contents of registers 29 and 26 do not change inasmuch as the output signals from gates 21 and 25 remain false.

As voltage $V_F$ continues to ramp up, voltage $V_F$ becomes equal to voltage $V_S$ at time T2. At this time, the output signal $Q_S$ produced by comparator 12 becomes true. This signal is supplied to OR gate 24 which produces a signal which is supplied to an input terminal of AND gate 25. This signal condition causes the output signal of gate 25 to be true for one clock time. The output signal $Q_{PE}$ from gate 25 clocks register 26 once, thereby transferring the digital number P from the indicated portion of register 27 into register 26 where it is stored until updated at time T2 of the next cycle.

The voltage $V_F$ continues to increase until it is equal to or greater than $V_H$. When $V_F$ equals $V_H$, comparator 11 produces a true output signal $Q_H$. This true signal is now supplied to the J input of flip-flop 18, which receives a false input signal at the K input terminal thereof. Consequently, with the next clock signal, the $Q_{HL}$ signal becomes true because of the true signal at the J input of flip-flop 18. The true $Q_{HL}$ signal is supplied to the activating terminal of switch S1 whereby switch S1 is energized and connects node 14 to ground via the switch and resistor $R_D$. Consequently, capacitor $C_A$ is discharged and voltage $V_F$ at node 14 drops toward zero.

The signal $Q_{HL}$ produced by flip-flop 18, of course, is now false. This false signal is supplied to one input terminal of OR gate 24 and to one input of gate 22. Consequently, gate 22 is disabled. However OR gate 24 produces a true output signal as a result of the true signal $Q_S$ and supplies the true signal to the D input of flip-flop 23 to one input terminal of AND gate 25. The other input terminal of gate 25 receives a true signal from the Q output terminal of flip-flop 23. As a result, the $Q_{PE}$ signal is also true until the next clock signal when the true signal at the D-input terminal of flip-flop 23 causes the $\overline{Q}$ output of flip-flop 23 to become false. Register 26 is clocked by the signal $Q_{PE}$ and the digital data (P) is transferred and stored in this register until updated during the next ramp cycle.

The true signal $Q_{HL}$ which is supplied to the D input terminal of flip-flop 20 is also supplied to an input terminal of gate 21. The signal $\overline{Q}_{DHL}$ remains in the true condition until the next subsequent clock pulse C. Consequently, for one clock pulse, gate 21 receives all true input signals and produces a true output signal which is supplied to clock input terminal of register 29.

Time period T4 represents the end of a particular cycle or the beginning of the next cycle. Time period T3–T4 is shown in exaggerated manner for illustrative purposes only. Time T4 may be analogized to time T0 in the cyclic operation. Thus, ramp voltage $V_F$ begins to increase again inasmuch as the initial conditions in the flip flops and gating circuit have been established by the discharge of voltage $V_F$ to a level below $V_L$. That is, signals $Q_L$, $Q_S$ and $Q_H$ are all false signals when the initial conditions exist including the false condition of $Q_{HL}$ signal wherein switch S1 is off or non-conductive.

The circuit operation previously described continues to occur in a cyclic or recirculating fashion. Voltage $V_F$ continues to ramp up and be discharged as a function of operation of switch S1. As the voltage $V_F$ continues to vary cyclically, signals $Q_L$, $Q_S$ and $Q_H$ will cyclically be driven from false to true conditions. Signals stored in the various registers such as register 27, register 29, or the like, will continue to interact with each other and the various adders. Moreover, inasmuch as signal $V_F$ is a variable, the operation of signal $Q_S$ will vary. That is, voltage $V_F$ will reach the level of voltage $V_S$ at different times depending upon the voltage of $V_S$. Consequently, the operation wherein the contents of register 27 are transferred to register 26 will vary. That is, since register 27 operates in a recirculating ramp-like function with adder 28 only so long as clock signals C are applied to gate 22 after voltage $V_F$ has attained voltage level $V_L$, the time required for $V_F$ to achieve voltage level $V_S$ controls the signal produced by register 27. Consequently, the signal is ultimately transferred to register 26 and, therefore utilization device 50 will vary as a direct function of the level of voltage $V_S$.

In an additional feature, a suitable detector 40 is connected to receive the P signals from register 27. These signals are arranged to produce an output signal from the detector when the P signals represent a function defined as $$P = 2^n - 2$$

When this signal condition is achieved, a true signal is applied to OR gate 24. Even if the other two input signals are false, this signal will produce a true signal of one clock signal duration from gate 25 to transfer the contents of D-register 26 to utilization device 50.

Thus, there has been shown and described an analog to digital converter which uses a ramp-type signal to control the digitizing of an analog signal. The ramp function also applies high and low limits to the digitizing operation so that substantially similar operation is assured. That is, only the same portion of the ramp signal is used in each cycle.

Also, there has been shown and described an analog to digital converter which is insensitive to slowly varying changes in the power supply voltage and includes compensation logic and circuitry which makes the converter relatively insensitive to resistance and capacitance values.

While those skilled in the art may conceive of modifications to this converter, any modifications which fall within the perview of this invention are intended to be included in this description. The scope of the invention is intended to be defined only by the appended claims.

Having thus described the preferred embodiment of the invention, what is claimed is:

1. In combination, ramp signal generating means, voltage divider means, comparator means connected to said ramp signal generating means and said voltage divider network in order to produce a signal representative of the relationship between signals produced by said ramp signal generating means and said voltage divider network, logic means connected to said comparator means to produce an output signal as a function of the signal produced by said comparator means, recirculating register means for producing an output signal representative of the digital signal, said recirculating register means connected to said logic circuit means to have the operation thereof controlled by the signals produced by said logic circuit means, said recirculating register means including output register means connected to supply output signals to a utilization device, first register means connected to selectively supply a portion of the contents thereof to said output register, first adder means for receiving said portion of the contents of said first register means, second register means connected to selectively receive the contents of said first adder means where the contents of said first adder means is the sum of the contents of said second register means and said portion of the contents of said first register means, and second adder means for adding the contents of said first register means to the contents of said second register means and selectively storing same in said first register means.

2. The combination recited in claim 1 wherein said voltage divider means includes a plurality of impedance elements at least one of which is variable, said voltage divider means producing a plurality of different voltages, said ramp signal generating means includes an RC circuit, and separate comparator means connected to compare the ramp signal produced by said ramp signal generating means and each of said plurality of different voltages.

3. The combination recited in claim 1 wherein said first register means includes a most significant bit portion and a least significant bit portion, said portion of the contents of said first register represents said most significant bit portion and an overflow condition.

4. The combination recited in claim 3 including logic means connected between said comparator means and each of said first and second register means to control the operation thereof whereby said first and second register means operate at different times as a function of the signal produced by said comparator means.

5. The combination recited in claim 1 including control means connected to said first register to receive said portion of the contents thereof, said control means operable to produce a control signal in response to a predetermined condition of said portion of the contents of said first register means, wherein said control signal is effective to activate said output register.

6. The combination recited in claim 1 wherein said ramp signal generating circuit produces a linear ramp signal.

7. The combination recited in claim 5 wherein said control means includes gate means connected to receive signals from said detector means, said gate means further connected to said comparator means to receive said signal representative of the relationship between signals produced by said ramp signal generator circuit and said voltage divider network, said gate means connected to supply a second control signal to said output register means when the representative signal from said comparator means achieves a predetermined status.

8. The combination recited in claim 7 wherein said control means includes:

bistable means, gate means connected to receive a signal from said bistable means and to selectively supply signals to said output register, each of said bistable means and said gate means connected to receive the same clock signal which controls the operation thereof whereby said gate means selectively supplies a signal to said output register when said clock signal is supplied thereto.

9. The combination recited in claim 1 including means connecting said logic means to said ramp signal generating circuit to reset the operation thereof when the ramp signal achieves a predetermined level as determined by said comparator means.

10. The combination recited in claim 1 including converter means for complementing said portion of the contents of said first register means which is received by said first adder means.

11. The combination recited in claim 1 wherein said logic means includes a plurality of bistable devices connected to said comparator means, said bistable devices producing output signals as a function of the signal produced by said comparator means, and gate means connected to said bistable means to receive output signals therefrom and to said recirculating register means to supply control signals thereto.

12. The combination recited in claim 11 including further bistable device connected to receive output signals from one of said plurality of bistable devices, said further bistable device connected to supply one output signal to said gate means, said further bistable device connected to supply the complement output signal to said first register means to reset said first register means to a predetermined condition.

13. The combination recited in claim 1 wherein said logic means includes means responsive to the output signal produced by said comparator means to produce control signals representative of different conditions of the signal produced by said ramp signal generating means, and means supplying a periodic signal to said logic means and to said recirculating means, said means responsive producing a first control signal when a periodic signal is supplied concurrent with a first condition of the signal produced by said ramp signal generating means, said first control signal being supplied to said first register to activate same, said means responsive producing a second control signal when a periodic signal is supplied concurrent with a second condition of the signal produced by said ramp signal generating means, said second control signal being supplied to said ramp generating means to inhibit operation thereof, to said second register to activate same, and reset control means connected to receive said second control signal from said means responsive and to supply a reset control signal to said first register means in response to the next periodic signal.

14. The combination recited in claim 1 wherein said output register produces an output signal which is a digital representation of the analog signal produced by said ramp signal generating means, said output register selectively energized by an output signal for said comparator means when the analog signal produced by said ramp signal generating means attains a predetermined condition whereby said output register stores a digital signal for periodic update, said first and second registers and said second adder interacting to produce said digital signals stored in said output register, said portion of the contents of said first register means comprising the most significant bits of the contents of said first register and comprising the digital signal to be stored in said output register, said first and second registers and said first adder interacting to produce a feedback path to vary the contents of said second register whereby the contents of said first register is varied by operation of said first adder.

* * * * *